US009279938B2

(12) United States Patent
Zhang

(10) Patent No.: US 9,279,938 B2
(45) Date of Patent: Mar. 8, 2016

(54) DUAL BAND COLOR FILTER

(71) Applicant: Sharp Laboratories of America, Inc., Camas, WA (US)

(72) Inventor: Jingyu Zhang, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 14/511,678

(22) Filed: Oct. 10, 2014

(65) Prior Publication Data

US 2015/0063748 A1    Mar. 5, 2015

(51) Int. Cl.
| G02B 6/26 | (2006.01) |
| G02B 6/122 | (2006.01) |
| G02B 6/12 | (2006.01) |
| H01L 31/054 | (2014.01) |
| G02B 5/00 | (2006.01) |
| G02B 5/20 | (2006.01) |
| B82Y 20/00 | (2011.01) |
| B82Y 30/00 | (2011.01) |

(52) U.S. Cl.
CPC .............. *G02B 6/1226* (2013.01); *G02B 5/008* (2013.01); *G02B 5/201* (2013.01); *G02B 6/12007* (2013.01); *H01L 31/0543* (2014.12); *H01L 31/0547* (2014.12); *H01L 31/0549* (2014.12); *B82Y 20/00* (2013.01); *B82Y 30/00* (2013.01); *G02B 6/12002* (2013.01); *G02B 2006/12035* (2013.01); *G02B 2006/12109* (2013.01); *G02B 2006/12123* (2013.01); *G02B 2006/12147* (2013.01); *Y02B 10/20* (2013.01); *Y02E 10/52* (2013.01); *Y10S 977/834* (2013.01)

(58) Field of Classification Search
CPC .............................. G02B 5/008; G02B 6/1226
See application file for complete search history.

(56) References Cited

U.S. PATENT DOCUMENTS

| 8,330,904 B2 | 12/2012 | Yoon | |
| 8,547,504 B2 | 10/2013 | Guo et al. | |
| 2012/0020608 A1* | 1/2012 | Gibson | G02B 6/1226 385/1 |
| 2014/0168742 A1* | 6/2014 | Hashimura | G02F 1/0018 359/245 |

OTHER PUBLICATIONS

Yokogawa et al., "Plasmonic Filters for CMOS Image Sensor Applications", Nano Letters, 2012,12, 4349-4354.

* cited by examiner

*Primary Examiner* — Omar R Rojas
(74) *Attorney, Agent, or Firm* — Law Offce of Gerald Maliszewski; Gerald Maliszewski

(57) ABSTRACT

A dual band color filter includes a periodic arrangement of metallic dots in a middle transparent medium, having an index of refraction, interposed between a first and a second transparent medium, each having an index of refraction greater than the middle transparent medium index of refraction. The filter accepts visible spectrum light. In response to the periodic arrangement of metallic dots, a surface plasmon mode is generated. In response to a diameter common to all the metallic dots, a local mode is generated, and in response to the combination of the middle, first, and second transparent medium indices of refraction, a waveguide mode is generated. As a result, two distinct wavelength bands of visible spectrum light are transmitted through the bottom surface of the dual band color filter, while attenuating one wavelength band of visible spectrum light.

20 Claims, 6 Drawing Sheets

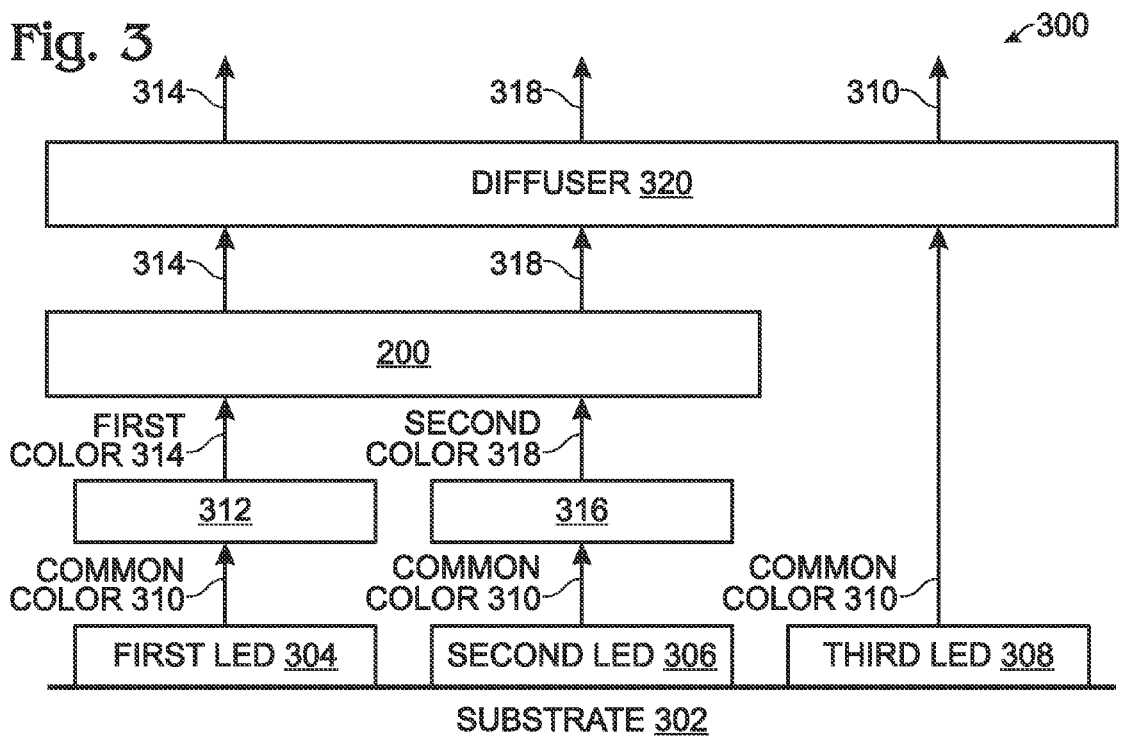
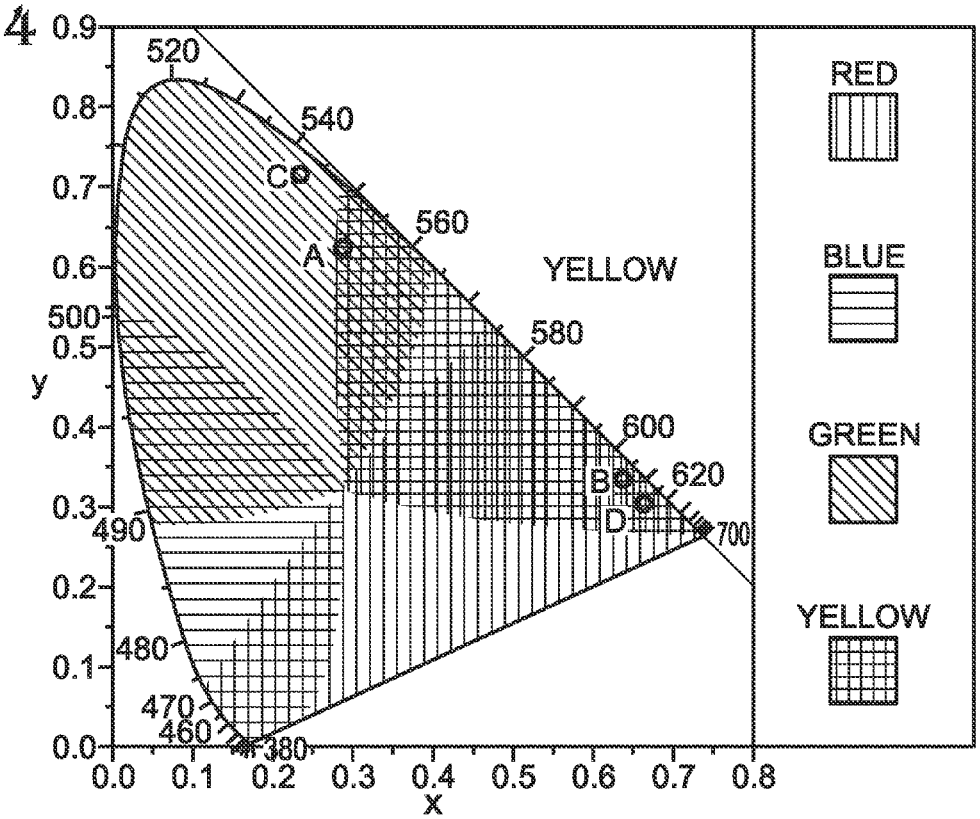

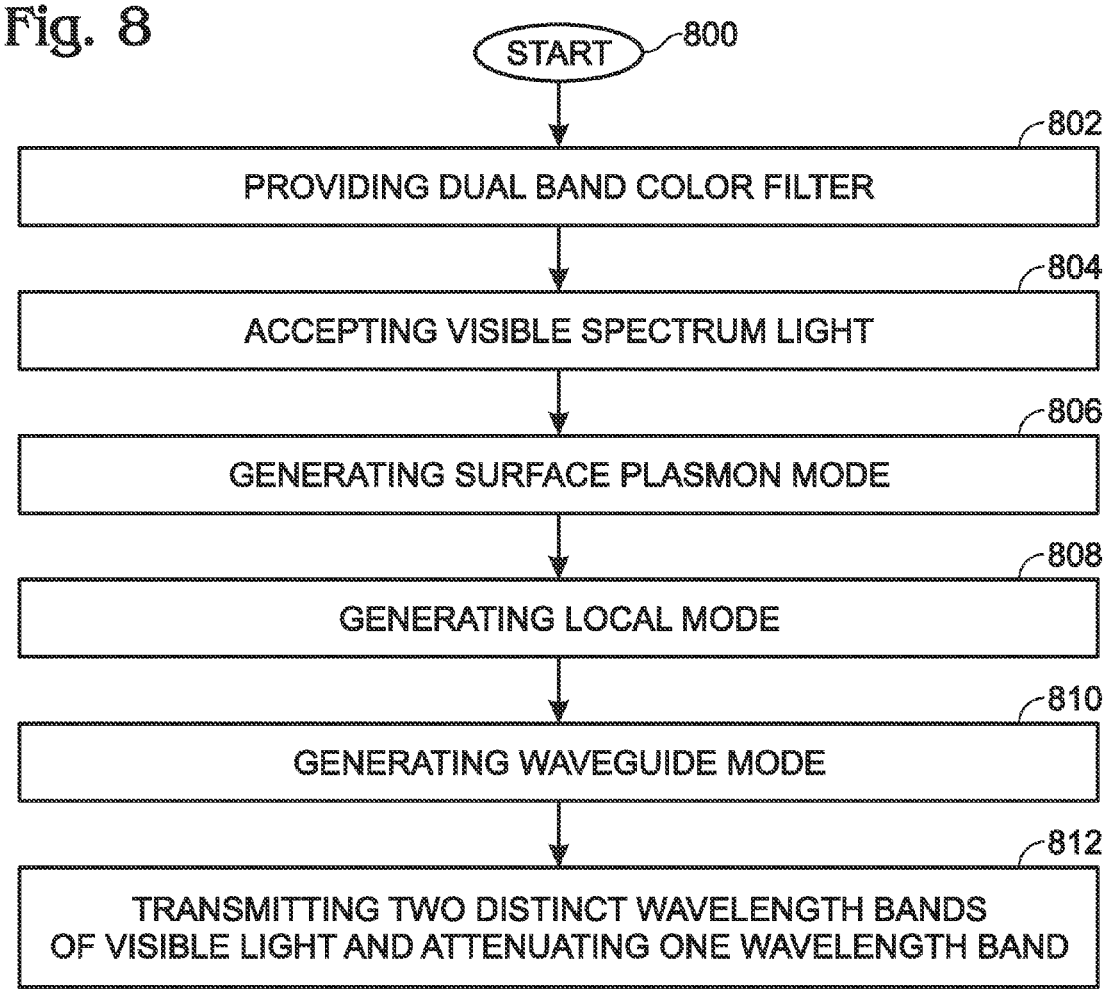

DUAL BAND COLOR FILTER

RELATED APPLICATION

The application is a Continuation-in-Part of an application entitled, ENERGY GENERATING TRANSPARENT FILM, invented by Aki Hashimura et al., Ser. No. 13/955,063, filed on Jul. 31, 2013;

which is a Continuation-in-Part of an application entitled, ENERGY-EFFICIENT TRANSPARENT SOLAR FILM, invented by Aki Hashimura et al., Ser. No. 13/872,473, filed on Apr. 29, 2013;

which is a Continuation-in-Part of an application entitled, AIR STABLE, COLOR TUNABLE PLASMONIC STRUCTURES FOR ULTRAVIOLET (UV) AND VISIBLE WAVELENGTH APPLICATIONS, invented by Aki Hashimura et al., Ser. No. 13/714,073, filed on Dec. 13, 2012;

which is a Continuation-in-Part of an application entitled, PLASMONIC IN-CELL POLARIZER, invented by Aki Hashimura et al., Ser. No. 13/558,396, filed on Jul. 26, 2012;

which is a Continuation-in-Part of an application entitled, PLASMONIC REFLECTIVE DISPLAY FABRICATED USING ANODIZED ALUMINUM OXIDE, invented by Aki Hashimura et al., Ser. No. 13/449,370, filed on Apr. 19, 2012;

which is a Continuation-in-Part of an application entitled, METHOD FOR IMPROVING METALLIC NANOSTRUCTURE STABILITY, invented by Aki Hashimura et al., Ser. No. 13/434,548, filed on Mar. 29, 2012;

which is a Continuation-in-Part of an application entitled, PLASMONIC ELECTRONIC SKIN, invented by Tang et al., Ser. No. 12/836,121, filed on Jul. 14, 2012, now U.S. Pat. No. 8,368,998;

which is a Continuation-in-Part of an application entitled, PLASMONIC DEVICE TUNED USING PHYSICAL MODULATION, invented by Tang et al., Ser. No. 12/646,585, filed on Dec. 23, 2009, now U.S. Pat. No. 8,223,425;

which is a Continuation-in-Part of an application entitled, PLASMONIC DEVICE TUNED USING LIQUID CRYSTAL MOLECULE DIPOLE CONTROL, invented by Tang et al., Ser. No. 12/635,349, filed on Dec. 10, 2009, now U.S. Pat. No. 8,355,099;

which is a Continuation-in-Part of an application entitled, PLASMONIC DEVICE TUNED USING ELASTIC AND REFRACTIVE MODULATION MECHANISMS, invented by Tang et al., Ser. No. 12/621,567, filed on Nov. 19, 2009, now U.S. Pat. No. 8,339,543;

which is a Continuation-in-Part of an application entitled, COLOR-TUNABLE PLASMONIC DEVICE WITH A PARTIALLY MODULATED REFRACTIVE INDEX, invented by Tang et al., Ser. No. 12/614,368, filed on Nov. 6, 2009, now U.S. Pat. No. 8,045,107. All the above-referenced applications are incorporated herein by reference.

BACKGROUND OF THE INVENTION

1. Field of the Invention

This invention generally relates to a visible wavelength color filter and, more particularly, to a color filter capable of transmitting two colors while attenuating a third color wavelength band.

2. Description of the Related Art

Recently, color conversion displays have attracted more attention. In order to achieve red, green, blue (RGB) three color pixels, blue light emitting diodes (LEDs)/organic LEDs (OLEDs) have been used as the blue pixel color, while pumping red and green phosphors, quantum dots, or organic materials to generate the red and green colors. Unfortunately, additional filtering is required to eliminate the emission of blue color from the red and green pixels, which adds to the size and cost of RGB displays. Further, when the blue pumped RGB technology is applied to a transparent display, the three color filters degrade the transparency, since only one wavelength is transparent for each pixel. For green and red pixels, any blue light passing through green and red materials affects the color quality.

It would be advantageous if a dual band color filter existed to block blue pumping light, while passing red and green light.

SUMMARY OF THE INVENTION

This disclosure presents a unique plasmonic color filter used for color conversion in display applications. A dual band color filter has been designed to pass green and red light simultaneously while at the same time attenuating the blue band. The filter fits the requirements for color conversion display. The full width at half maximum (FWHM) for each pass band can be made less than 30 nanometers (nm). The spectra of phosphors are shaped by the filter, and the remaining blue light is attenuated. Compared with the broadband of the original phosphor spectrum, the filter provides a better color gamut, with the transmission for green and red being about 70%. Transparency is better than using two separate color filters, and the fabrication process is also easier.

The color filter includes a high refractive index waveguide, a plasmonic metallic structure in low index refractive index medium, and another high refractive index waveguide. The structure may be encapsulated in a glass medium. The structure combines the coupling of three modes: waveguide modes+surface plasmon wave absorption+local modes. At the resonant wavelength, an electric field is induced on each side of a metallic disc. The electric field distribution is symmetric, which gives strong transmission peaks. The structure supports the first order resonance for long wavelengths, and the second order for short wavelengths. At non-resonant wavelengths, the electric field is blocked by metallic disk or absorbed by surface plasmon waves. The electric field distribution is non-symmetric even though the structure is symmetric.

Accordingly, a method is provided for transmitting two bands of visible spectrum light, while attenuating a third band of visible spectrum light. The method provides a dual band color filter including a periodic arrangement of metallic dots in a middle transparent medium, having an index of refraction, interposed between a first and a second transparent medium, each having an index of refraction greater than the middle transparent medium index of refraction. The method accepts visible spectrum light incident to a top surface of the dual band color filter. In response to the periodic arrangement of metallic dots, a surface plasmon mode is generated. In response to a diameter common to all the metallic dots, a local mode is generated, and in response to the combination of the middle, first, and second transparent medium indices of refraction, a waveguide mode is generated. As a result of the combination of the surface plasmon mode, local mode, and waveguide mode, two distinct wavelength bands of visible spectrum light are transmitted through the bottom surface of the dual band color filter, while attenuating one wavelength band of visible spectrum light. As noted above, the filter may transmit the green and red spectrums light while attenuating blue spectrum light. However, it would be possible to adjust the filter to transmit and attenuate different bands of color.

Typically, the first index of refraction is equal to the second index of refraction, with a value greater than 1.5. The first and second transparent mediums may be silicon nitride, aluminum oxide, or hafnium oxide. The middle transparent medium may be silicon dioxide or magnesium fluoride, and metallic dots may be aluminum, gold, silver, or copper.

Additional details of the above-described method, a dual band color filter, and a red, green, blue color pixel made with a dual band color filter are described in greater detail below.

BRIEF DESCRIPTION OF THE DRAWINGS

FIG. 3 is a partial cross-sectional view of a red, green, blue (RGB) color pixel.

FIG. 4 is a diagram depicting a CIE 1931 color map.

FIG. 8 is a flowchart illustrating a method for transmitting two bands of visible spectrum light while attenuating a third band of visible spectrum light.

DETAILED DESCRIPTION

Figure 2:
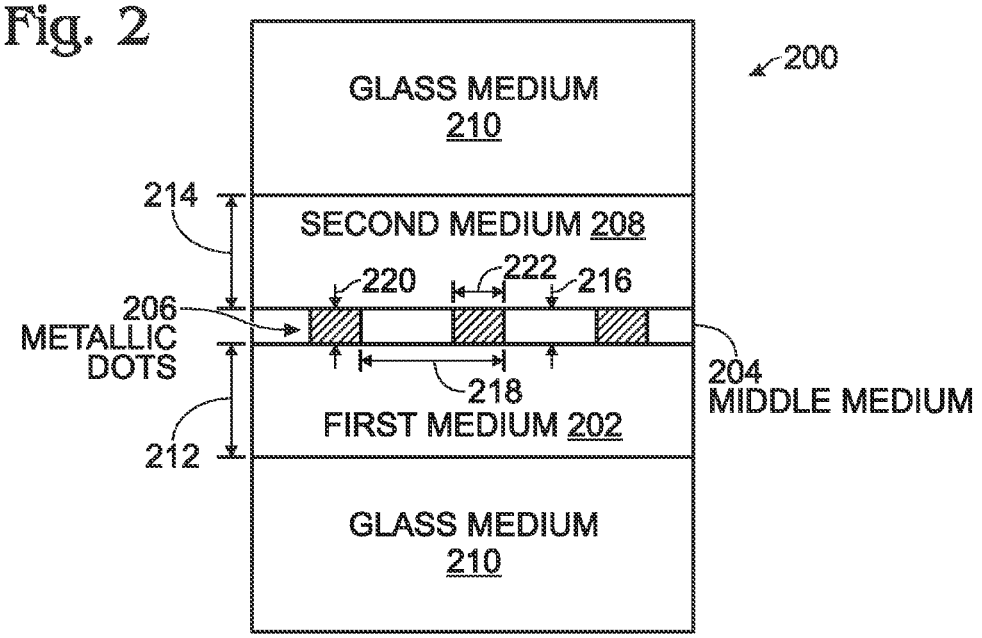
FIG. 2 is a partial cross-sectional view of a dual band color filter.

FIG. 2 is a partial cross-sectional view of a dual band color filter. The filter 200 comprises a first transparent medium 202 having first index of refraction. A middle transparent medium 204 has an index of refraction less that the first index of refraction. A periodic arrangement of metallic dots 206 is formed in the middle transparent medium 204. By "periodic" it is meant that the spacing between the metallic dots 206 is uniform. The metallic dots 206 are not limited to any particular shape. For example, they may be disks or square in shape. A second transparent medium 208 has a second index of refraction greater than the middle index of refraction. The filter 200 is shown encased on the top and bottom with a glass medium 210.

Typically, the first and second indices of refraction are greater than 1.5. Thus, the middle index of refraction is less than 1.5. It is also typical that the first index of refraction be equal to the second index of refraction. The first transparent medium 202 and the second transparent medium 208 are independently selected (may be the same or different material) from a group of materials that includes silicon nitride, aluminum oxide, and hafnium oxide. Other materials with the proper index of refraction may also be used, and it is typical, but not necessary, that the first transparent medium 202 and the second transparent medium 208 are the same material. The middle transparent medium 204 may be silicon dioxide or magnesium fluoride, but other materials with an index of refraction less than 1.5 may also be used. The metallic dots 206 may be aluminum, gold, silver, or copper to name a few examples.

In one aspect, first transparent medium 202 and the second transparent medium 208 have a refractive index of 2 and respective thicknesses 212 and 214 of 300 nanometers (nm). In this example, the middle transparent medium 204 has a refractive index of 1.45 and a thickness 216 of 80 nm. The metallic dots 206 are aluminum disks, with a pitch (period) 218 of 350 nm, a radius 222 of 150 nm, and a thickness 220 of 80 nm. This particular filter attenuates blue spectrum light and transmits green and red spectrum light. However, adjustments to the above-mentioned variables can be used to change the transmitted and attenuated wavelengths of light.

In this example, the thickness of the metallic dots is the same as the thickness of the middle transparent medium, but this need not always be the case. In some aspects not shown, the metallic dots have a smaller thickness than the middle transparent medium. Further, these smaller thickness metallic dots may be located at the top surface of the middle transparent medium (the interface to the second transparent medium), the bottom surface of the middle transparent medium (the interface to the first transparent medium), or surrounded top and bottom by the middle transparent medium.

There are three optical modes involving in the color filter. They are a surface plasmon mode due to the periodic metallic dots, a local mode due to each metallic dot, and waveguide modes guided in the sandwiching high index mediums.

Figure 1:
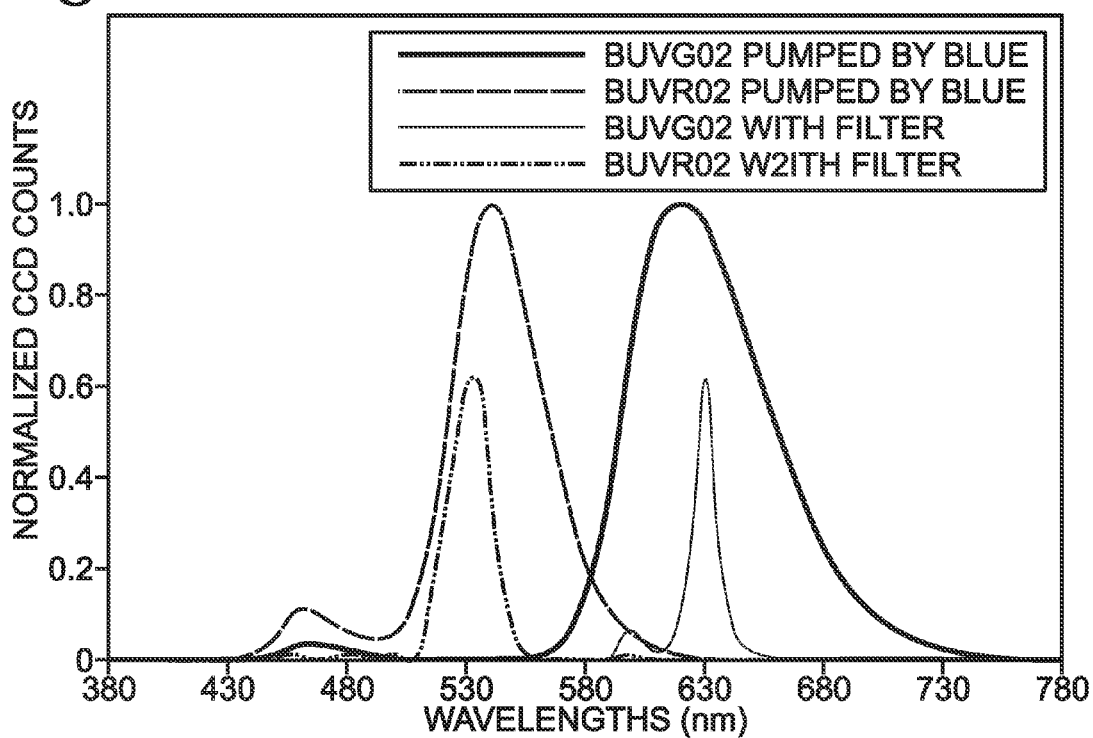
FIG. 1 is a graph depicting the normalized spectra of green and red phosphors pumped by a blue LED and shaped by the dual band color filter.

FIG. 1 is a graph depicting the normalized spectra of green and red phosphors pumped by a blue LED and shaped by the dual band color filter. Phosphors BUVG02 (green) and BUVRG02 (red) are shown before and after filtering.

FIG. 3 is a partial cross-sectional view of a red, green, blue (RGB) color pixel. The RGB pixel 300 comprises a substrate 302, with a first light emitting diode (LED) 304, second LED 306, and a third LED 308 overlying the substrate 302. Each LED emits a common color 310 (the same color). A first color generating material 312 overlies the first LED 304 emitting a first color 314 (with some common color leakage) in response to receiving the common color 310. A second color generating material 316 overlies the second LED 306 emitting a second color 318 (with some common color 310 leakage) in response to receiving the common color. The first and second color generating materials 312 and 316 may be quantum dots or phosphors. The use of quantum dots and phosphors in the fabrication of displays is well known in the art.

A dual band color filter 200 overlies the first LED 304 and the second LED 306. Details of the dual band color filter have been described above in detail (see FIG. 2) and are not repeated here in the interest of brevity. A diffuser 320 overlies the RGB pixel 300. The diffuser 320 scatters the three colors of light over a wide angle. In one aspect, the common color 310 is blue, the first color 314 is green, and the second color 318 is red, so that the dual band color filter 200 attenuates light in the blue spectrum and transmits light in the green and red spectrums. In one aspect not shown, an attenuator may be used over the third LED if the common color emitted by the third LED is significantly more intense that the colors being emitted through the dual band color filter. This is often the case when the common color is blue.

FIG. 4 is a diagram depicting a CIE 1931 color map. For use with blue LEDs, the dual band color filter may be designed to pass green and red light simultaneously, while at the same time attenuating the blue band. The full width half maximum (FWHM) for each band can be made narrower than 30 nm. Compared with the broadband of the original phosphor spectrum (points A and B), the filter provides a better color gamut, as shown in the figure (points C and D). Points A (0.288, 0.629) and B (0.641, 0.337) represent the color quality for conventional color phosphors (Phosphors Technology Cooperation BUVG02 and BUVR02) with a blue pumping light. Points C (0.178, 0.754) and D (0.671, 0.31) represent the improved color quality when the same materials are covered by the dual band color filter. The transmission for green and red may be 70% or greater. By using the filter, the color marks move further into both the green and the red regions of the gamut. Thus, the filter improves the color saturation of the phosphors.

Figure 5:
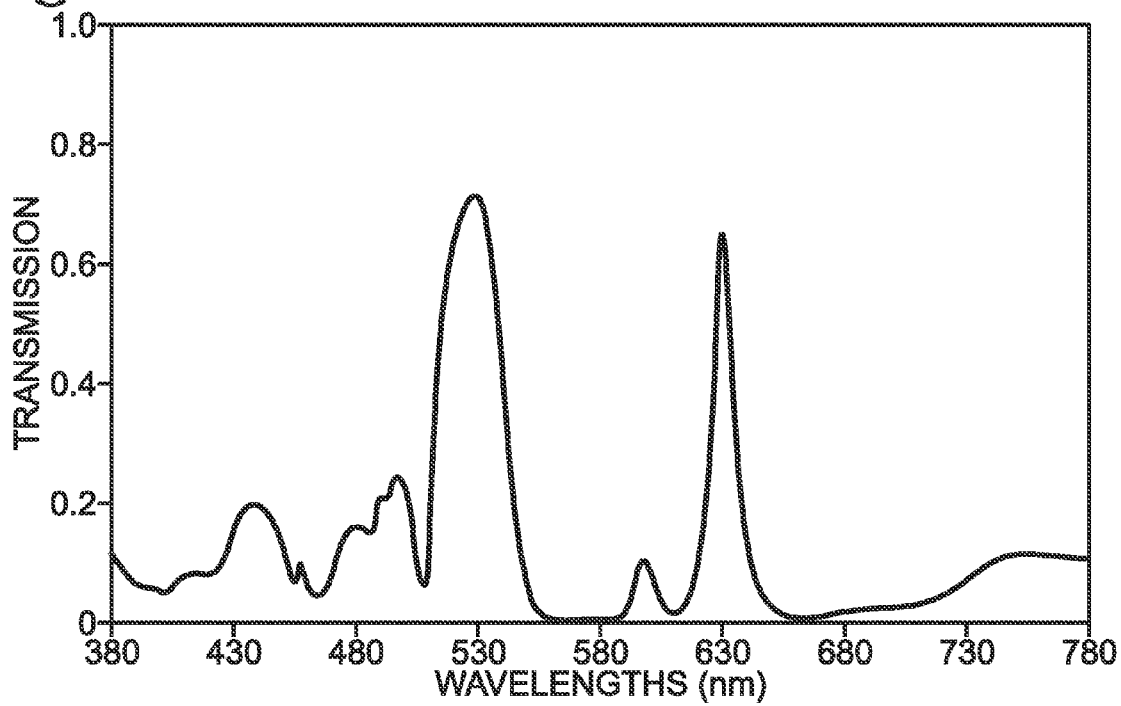
FIG. 5 is a graph depicting the transmission spectrum of a dual band filter with resonant peaks at 540 nm (green) and 650 nm (red) with 73% and 68% transmission respectively.

FIG. 5 is a graph depicting the transmission spectrum of a dual band filter with resonant peaks at 540 nm (green) and 650 nm (red) with 73% and 68% transmission, respectively. The high refractive index=2, and the thickness=300 nm for each high index (first and second) medium. The low (middle) refractive index=1.45 and its thickness=80 nm. The metal is aluminum (Al). The pitch of the Al dots is 350 nm and the radius of the dots is 150 nm. The thickness of the metal dots is 80 nm.

Figure 6A:
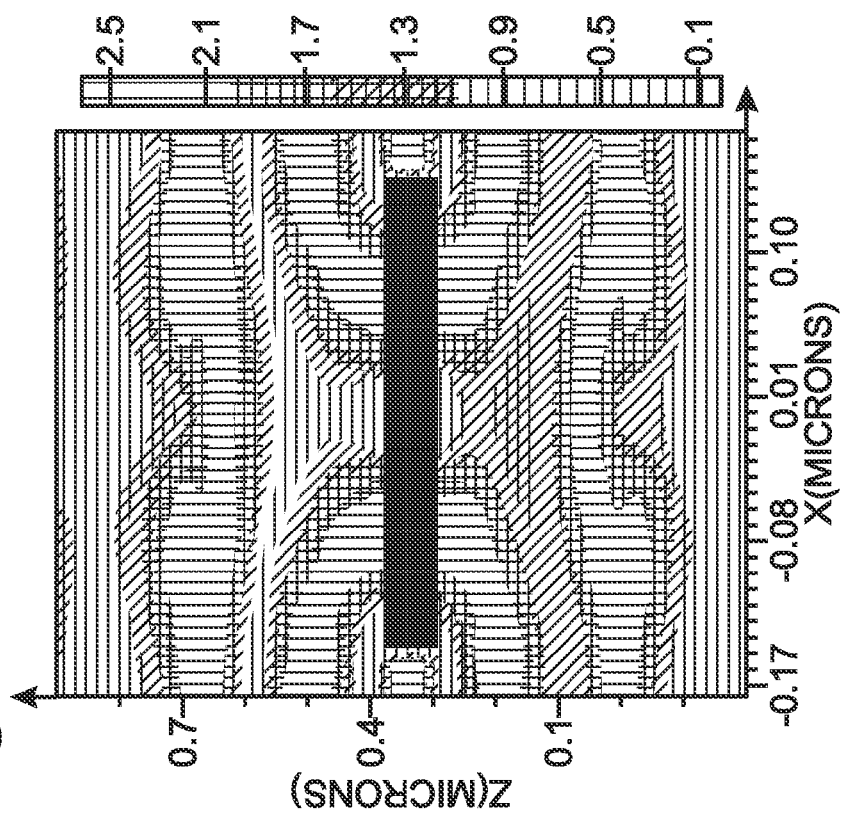
FIGS. 6A through 6D are simulations of the electric field distribution of a unit cell in a cross-sectional view (see FIG. 2), plotted at the transmission peaks of 540 nm and 650 nm, and the transmission dips of 720 nm and 580 nm.
Figure 6B:
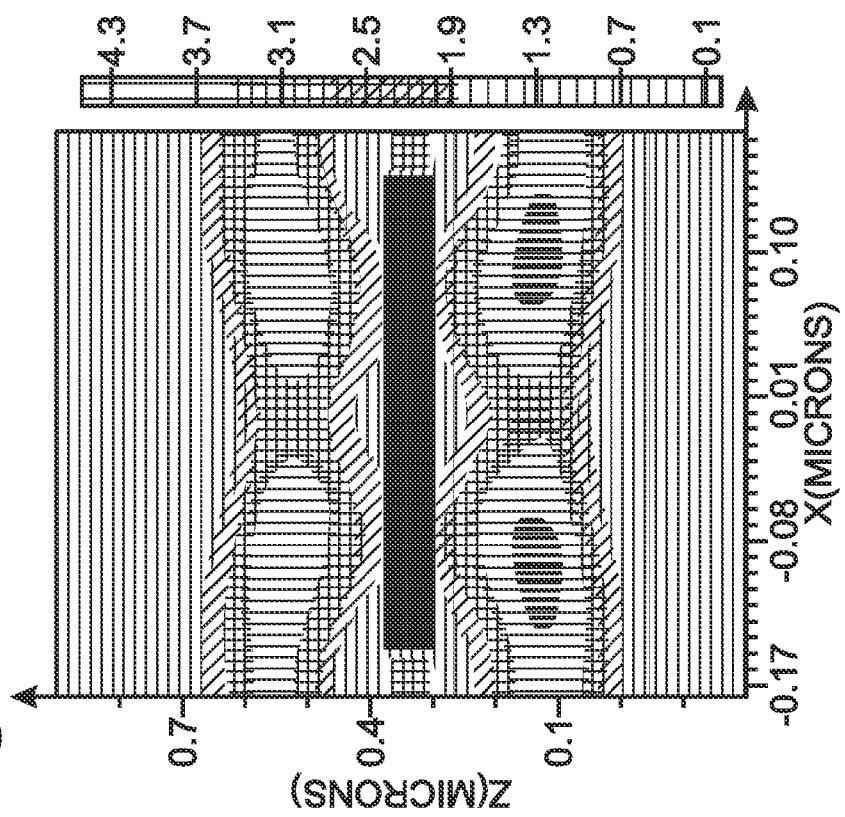
Figure 6C:
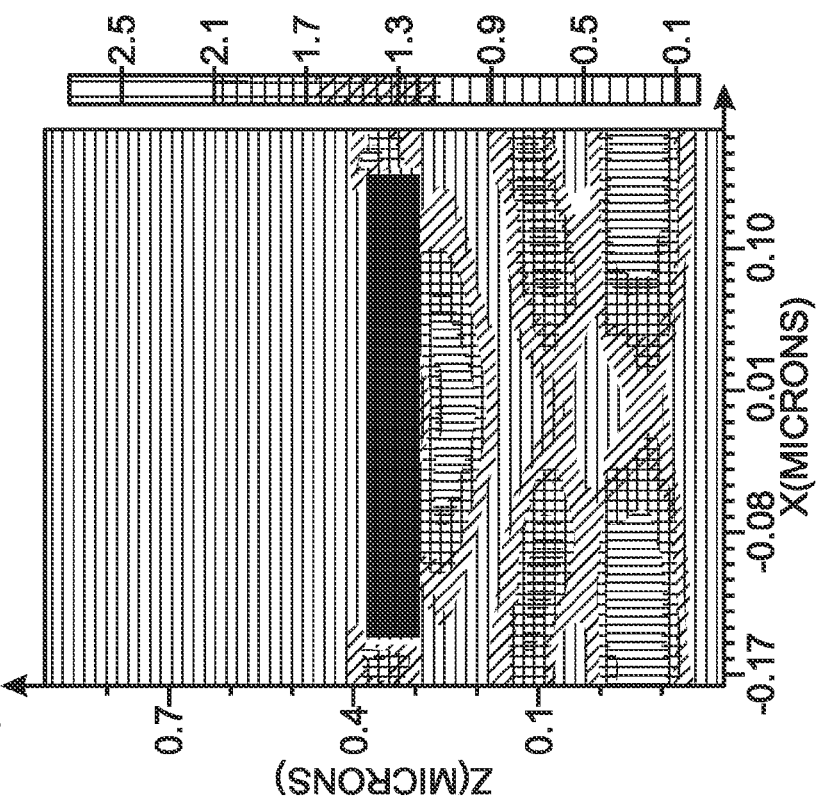
Figure 6D:
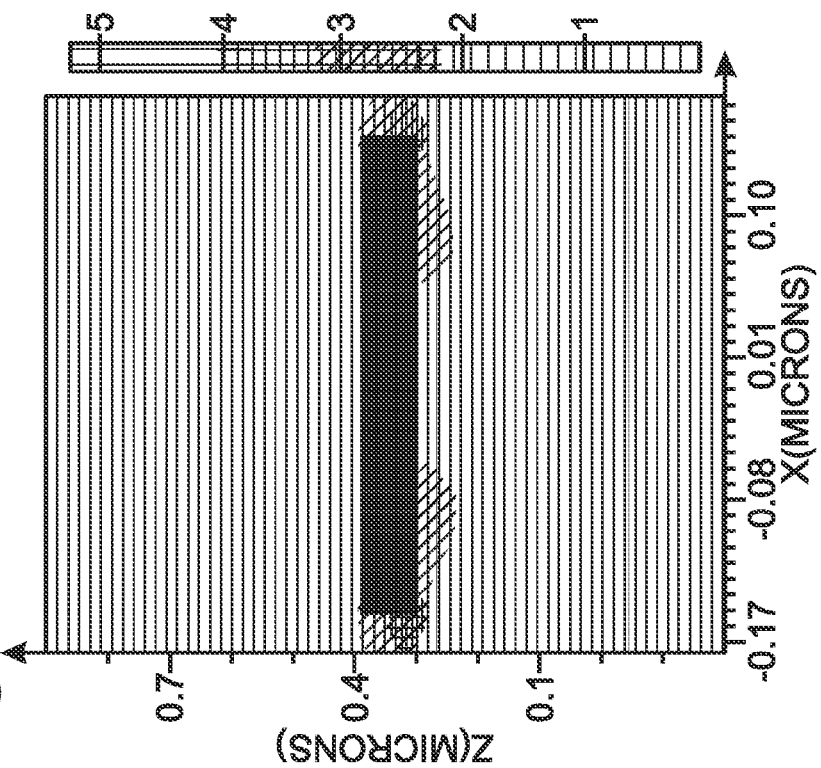

FIGS. 6A through 6D are simulations of the electric field distribution of a unit cell in a cross-sectional view (see FIG. 2), plotted at the transmission peaks of 540 nm and 650 nm, and the transmission dips of 720 nm and 580 nm. The center dark area with the rectangular shape is a cross-section view of an Al disc, which is not transparent for the visible wavelengths. As shown in the FIGS. 6A and 6B, the transmission peaks are due to the induced electric field on each side of the Al disk, which causes a symmetric distribution of electric field. So the structure is transparent to light at the two pass wavelengths. The structure allows the long wavelength at 650 nm to pass as the first order mode and short wavelength at 540 nm to pass as the second order mode. The electric field distribution at 720 nm in FIG. 6C shows the surface plasmon wave distribution, which causes light absorption. At the 580 nm wavelength, the Al disc acts as a mirror which reflects the incident light hack, as shown in FIG. 6D. Therefore, there are transmission dips in the spectrum at these two wavelengths (720 nm and 580 nm).

The resonant wavelengths of surface plasmon waves (SPWs) is expressed in Eq. (1), where Λ is the pitch of the grating, with $\epsilon_m(\lambda)$ and $\epsilon_d$ being the dielectric constants of the metal and dielectric, respectively.

$$m\lambda = \Lambda \cdot \left( \sqrt{\frac{\epsilon_d \epsilon_m(\lambda)}{\epsilon_d + \epsilon_m(\lambda)}} \pm \sin(\theta) \right) \quad (1)$$

$\epsilon_m(\lambda)$ is expressed by the Drude formula in Eq. (2), where $\lambda_p$ and $\lambda_y$ are the electron plasma wavelength and scattering wavelength. The pitch, the permittivity of incident medium and substrate, and the polarization angle of incident light influence the resonance wavelength.

$$\epsilon_m(\lambda) = 1 - \frac{\frac{1}{\lambda_p^2}}{\frac{1}{\lambda} \cdot \left( \frac{1}{\lambda} + i \cdot \frac{1}{\lambda_y} \right)} \quad (2)$$

Figure 7:
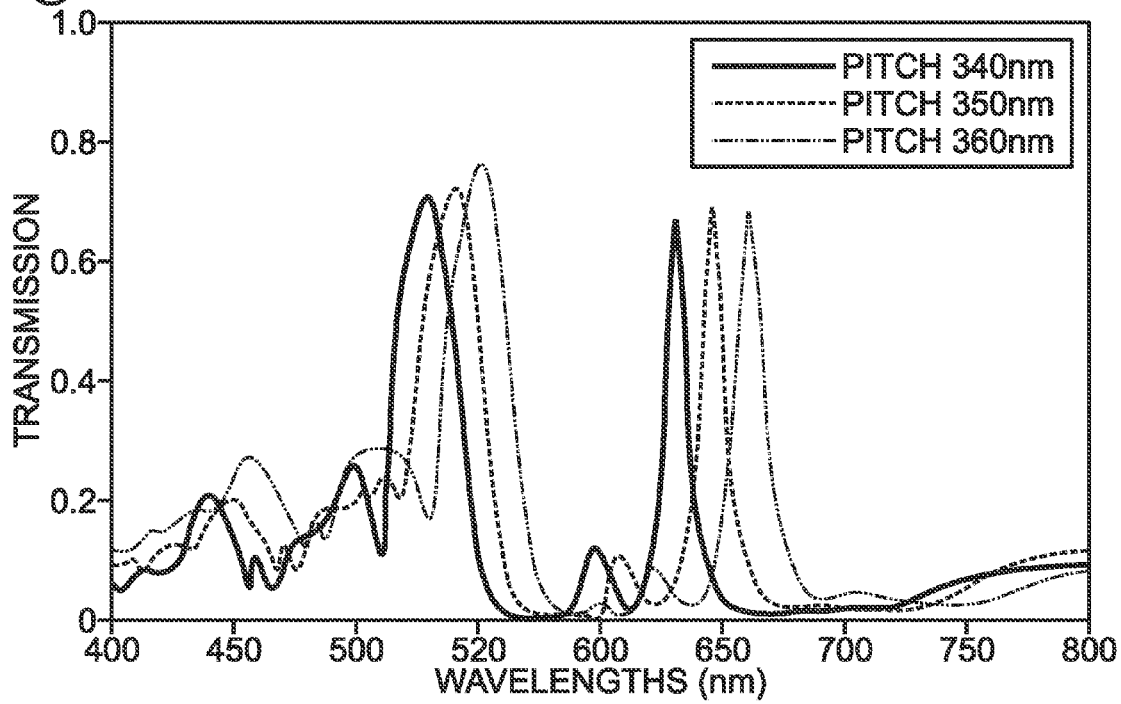
FIG. 7 is a diagram depicting transmission peaks that are varied by tuning the pitch of the metallic dots.

FIG. 7 is a diagram depicting transmission peaks that are varied by tuning the pitch of the metallic dots. For a pitch=350 nm, the SPWs occurs at 720 nm with a dielectric index n=2, and at 520 nm with an index n=1.45.

When decreasing the pitch of the metallic dots to 340 nm, the SPWs occurs at 699 nm1507 nm, for n=2 and n=1.45, respectively. When increasing the pitch to 360 nm, the SPWs occur at 738 nm/535 nm for n=2 and n=1.45. By tuning the structure pitch, the transmission peaks can be tuned and adjusted to desired wavelength range.

In summary, the dual band color filter combines a high index waveguide, low index waveguide, and plasmonic metallic dots. The metallic dots can induce an electric field on each side of the dots, opposite to the incoming light, forming a symmetric electric field distribution on both sides of the dot. The structure allows two orders of electric modes which transmits red color and green color simultaneously.

FIG. 8 is a flowchart illustrating a method for transmitting two bands of visible spectrum light while attenuating a third band of visible spectrum light. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and corresponds to the explanation of the figures presented above. The method starts at Step 800.

Step 802 provides a dual band color filter comprising a periodic arrangement of metallic dots in a middle transparent medium, having an index of refraction, interposed between a first and a second transparent medium, each having an index of refraction greater than the middle transparent medium index of refraction. In one aspect, the first index of refraction equal to the second index of refraction. In another aspect, the first and second indices of refraction are greater than 1.5.

The first and second transparent mediums are independently selected from a group of materials that include silicon nitride, aluminum oxide, and hafnium oxide. The middle transparent medium may be a material such as silicon dioxide or magnesium fluoride, and metallic dots may be aluminum, gold, silver, or copper. These materials are only examples, as the dual band filter is not limited to any particular material.

Step 804 accepts visible spectrum light incident to a top surface of the dual band color filter. In response to the periodic arrangement of metallic dots, Step 806 generates a surface plasmon mode. In response to a diameter common to all the metallic dots, Step 808 generates a local mode. In response to the combination of the middle, first, and second transparent medium indices of refraction, Step 810 generates a waveguide mode. In response to the combination of the surface plasmon mode, local mode, and waveguide mode, Step 812 transmits two distinct wavelength bands of visible spectrum light through a bottom surface of the dual band color filter, and attenuates one wavelength band of visible spectrum light. The two distinct wavelength bands of visible spectrum light being transmitted may be the green and red spectrums light and the attenuated spectrum light may be blue.

A dual band color filter has been presented. Various geometries and materials have been used to illustrate the invention. However, the invention is not limited to merely these examples. Other variations and embodiments of the invention will occur to those skilled in the art.

I claim:

1. A method for transmitting two bands of visible spectrum light while attenuating a third band of visible spectrum light, the method comprising:

providing a dual band color filter comprising a periodic arrangement of metallic dots in a middle transparent medium, having an index of refraction, interposed between a first and a second transparent medium, each having an index of refraction greater than the middle transparent medium index of refraction;

accepting visible spectrum light incident to a top surface of the dual band color filter;

in response to the periodic arrangement of metallic dots, generating a surface plasmon mode;

in response to a diameter common to all the metallic dots, generating a local mode;

in response to the combination of the middle, first, and second transparent medium indices of refraction, generating a waveguide mode; and, in response to the combination of the surface plasmon mode, local mode, and waveguide mode, transmitting two distinct wavelength bands of visible spectrum light through a bottom surface of the dual band color filter, and attenuating one wavelength band of visible spectrum light.

2. The method of claim 1 wherein transmitting the two distinct wavelength bands of visible spectrum light includes transmitting green and red spectrum light and attenuating blue spectrum light.

3. The method of claim 1 wherein providing the dual band color filter includes providing the first index of refraction equal to the second index of refraction.

4. The method of claim 1 wherein providing the dual band color filter includes providing the first and second indices of refraction greater than 1.5.

5. The method of claim 1 wherein providing the dual band color filter includes:
providing first and second transparent mediums independently selected from a group of materials consisting of silicon nitride, aluminum oxide, and hafnium oxide; and,
providing the middle transparent medium selected from a group of materials consisting of silicon dioxide and magnesium fluoride.

6. The method of claim 1 wherein providing the dual band color filter includes providing the metallic dots from a material selected from a group consisting of aluminum, gold, silver, and copper.

7. A dual and color filter comprising:
a first transparent medium having a first index of refraction;
a middle transparent medium having an index of refraction less that the first index of refraction;
a periodic arrangement of metallic dots formed in the middle transparent medium;
a second transparent medium having a second index of refraction greater than the middle index of refraction;
wherein first and second transparent mediums are independently selected from a group of materials consisting of silicon nitride, aluminum oxide, and hafnium oxide; and,
wherein the middle transparent medium is selected from a group of materials consisting of silicon dioxide and magnesium fluoride.

8. The filter of claim 7 wherein the first index of refraction is equal to the second index of refraction.

9. The filter of claim 7 wherein the first and second indices of refraction are greater than 1.5.

10. The filter of claim 7 wherein the metallic dots are a material selected from a group consisting of aluminum, gold, silver, and copper.

11. The filter of claim 7 wherein the first and second transparent mediums have a refractive index of 2 and a thickness of 300 nanometers (nm);

wherein the middle transparent medium has a refractive index of 1.45 and a thickness of 80 nm; and, wherein the metallic dots are aluminium disks, with a pitch of 350 nm, a radius of 150 nm, and a thickness of 80 nm.

12. The filter of claim 11 wherein the filter attenuates blue spectrum light and transmits green and red spectrum light.

13. A red, green, blue (ROB) color pixel comprising:
a substrate;
first, second, and third light emitting diodes (LED) overlying the substrate, each LED emitting a common color;
a first color generating material overlying the first LED emitting a first color in response to receiving the common color;
a second color generating material overlying the second LED emitting a second color in response to receiving the common color;
a dual band color filter overlying the first and second LEDs, the dual band color filter comprising:
a first transparent medium having a first index of refraction;
a middle transparent medium having an index of refraction less that the first index of refraction;
a periodic arrangement of metallic dots formed in the middle transparent medium; and,
a second transparent medium having a second index of refraction greater than the middle index of refraction.

14. The ROB pixel of claim 13 wherein the common color is blue, the first color is green, and the second color is red; and,
wherein the dual band color filter attenuates light in the blue spectrum and transmits light in the green and red spectrums.

15. The RGB pixel of claim 14 wherein the first and second transparent mediums have a refractive index of 2 and a thickness of 300 nanometers (nm);

wherein the middle transparent medium has a refractive index of 1.45 and a thickness of 80 nm; and, wherein the metallic dots are aluminum disks, with a pitch of 350 nm, a radius of 150 nm, and a thickness of 80 nm.

16. The RGB pixel of claim 13 wherein the first index of refraction is equal to the second index of refraction.

17. The RGB pixel of claim 13 wherein the first and second indices of refraction are greater than 1.5.

18. The RGB pixel of claim 13 wherein first and second transparent mediums are independently selected from a group of materials consisting of silicon nitride, aluminum oxide, and hafnium oxide; and,
wherein the middle transparent medium is selected from a group of materials consisting of silicon dioxide and magnesium fluoride.

19. The RGB pixel of claim 13 wherein the metallic dots are a material selected from a group consisting of aluminum, gold, silver, and copper.

20. The RGB pixel of claim 13 wherein the first and second color generating materials are selected from a group consisting of quantum dots and phosphors.

* * * * *

UNITED STATES PATENT AND TRADEMARK OFFICE
CERTIFICATE OF CORRECTION

Page 1 of 1

PATENT NO.       : 9,279,938 B2
APPLICATION NO.  : 14/511678
DATED            : March 8, 2016
INVENTOR(S)      : Jingyu Zhang It is certified that error appears in the above-identified patent and that said Letters Patent is hereby corrected as shown below:

Claims

In column 7, at line 33 (claim 7), the phrase "dual band color" has been incorrectly printed as --dual and color--.

Signed and Sealed this
Third Day of May, 2016

Michelle K. Lee
*Director of the United States Patent and Trademark Office*